(12) United States Patent
Eguchi et al.

(10) Patent No.: US 10,468,372 B2
(45) Date of Patent: Nov. 5, 2019

(54) SEMICONDUCTOR APPARATUS (71) Applicant: Mitsubishi Electric Corporation, Tokyo (JP)

(72) Inventors: Keisuke Eguchi, Tokyo (JP); Yoshitaka Kimura, Tokyo (JP); Akihiko Yamashita, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/857,931

(22) Filed: Dec. 29, 2017

(65) Prior Publication Data
US 2018/0374817 A1 Dec. 27, 2018

(30) Foreign Application Priority Data

Jun. 21, 2017 (JP) ................. 2017-121516

(51) Int. Cl.
H01L 23/02 (2006.01)
H01L 23/00 (2006.01)
H01L 23/053 (2006.01)
H01L 25/07 (2006.01)

(52) U.S. Cl.
CPC ............ *H01L 24/72* (2013.01); *H01L 23/02* (2013.01); *H01L 23/053* (2013.01); *H01L 25/072* (2013.01); *H01L 2224/32225* (2013.01); *H01L 2224/48091* (2013.01);
(Continued)

(58) Field of Classification Search
CPC ..... H01L 24/72; H01L 23/02; H01L 2224/90; H01L 23/48; H01L 23/481
See application file for complete search history.

(56) References Cited

U.S. PATENT DOCUMENTS 4,679,871 A * 7/1987 Egawa ................. H05K 7/1046
439/70
4,729,739 A * 3/1988 Coffee ................. H05K 7/1046
439/71
(Continued)

FOREIGN PATENT DOCUMENTS

| EP | 1 956 651 A1 | 8/2008 |
| JP | 2008-198597 A | 8/2008 |
| JP | 2014-123618 A | 7/2014 |

*Primary Examiner* — Charles D Garber
*Assistant Examiner* — S M Sohel Imtiaz
(74) *Attorney, Agent, or Firm* — Studebaker & Brackett PC (57) ABSTRACT According to the present invention, a semiconductor apparatus includes a semiconductor device, a case surrounding the semiconductor device, a spring terminal including a first connection portion extending to a top surface of the case, and a second connection portion provided on the top surface of the case and a control substrate provided on the second connection portion, wherein the first connection portion is connected to the semiconductor device, the second connection portion includes a first end connected to an end of the first connection portion, and a second end opposite to the first end, the second connection portion being a flat plate and having an elastic force using the first end as a supporting point, the second end contacts the control substrate with an elastic force, and the second connection portion has a constriction structure having a notch formed in a side surface along a longitudinal direction.

16 Claims, 9 Drawing Sheets (52) U.S. Cl.
CPC .............. *H01L 2224/48227* (2013.01); *H01L 2224/73265* (2013.01); *H01L 2224/90* (2013.01)

(56) References Cited

U.S. PATENT DOCUMENTS

| | | | | |
|---|---|---|---|---|
| 5,109,317 | A * | 4/1992 | Miyamoto | H01L 23/4006 165/80.3 |
| 5,747,875 | A * | 5/1998 | Oshima | H01L 25/16 257/687 |
| 6,181,590 | B1 * | 1/2001 | Yamane | H01L 25/162 257/E25.03 |
| 6,439,448 | B1 * | 8/2002 | Ringler | B23K 20/004 228/1.1 |
| 6,791,170 | B1 * | 9/2004 | Fuku | H05K 7/1417 257/678 |
| 10,002,812 | B2 * | 6/2018 | Gobl | H05K 7/209 |
| 2002/0055282 | A1 * | 5/2002 | Eldridge | G01R 1/0483 439/66 |
| 2013/0015578 | A1 * | 1/2013 | Thacker | H01L 24/13 257/738 |
| 2013/0048359 | A1 * | 2/2013 | Ihara | H05K 3/3484 174/258 |
| 2013/0344718 | A1 * | 12/2013 | Kobayashi | H01R 12/57 439/83 |
| 2018/0331080 | A1 * | 11/2018 | Geissler | H01L 23/48 |

* cited by examiner

SEMICONDUCTOR APPARATUS

BACKGROUND OF THE INVENTION

Field

The present invention relates to a semiconductor apparatus.

Background

JP 2008-198597 A discloses a power semiconductor module including a contact spring leading from a substrate or semiconductor device to the outside of the power semiconductor module. The contact spring has a curved portion and is formed of a metal plate that is formed by die cutting and bending techniques. JP 2014-123618 A discloses an external connection terminal which has elasticity in the vertical direction due to its spring structure and contacts a semiconductor device. The shape of the external connection terminal is deformed in the horizontal direction in accordance with a deformation in the vertical direction.

A spring terminal disclosed in JP 2008-198597 A has a spring property only in a height direction. This makes it difficult to relax a stress in a planar direction. Accordingly, in the power semiconductor module, for example, if a positional deviation in the planar direction occurs in a control substrate, which is connected to the contact spring, due to a vibration or the like, a contact failure may occur between the contact spring and the control substrate. In some cases, the control substrate is fixed to the power semiconductor module by using a lid or the like to press the control substrate, without using any screw. Particularly in such cases, the contact failure is likely to occur.

In addition, a tip end of an external connection terminal disclosed in JP 2014-123618 A is pressed against a semiconductor device, a substrate, or the like and is thus brought into contact therewith. As a result, the semiconductor module is electrically connected to an external device. In this structure, the substrate or semiconductor device may be damaged, which may cause a contact failure.

SUMMARY

The present invention has been made to solve the above-mentioned problem, and an object of the present invention is to provide a semiconductor apparatus with improved reliability.

The features and advantages of the present invention may be summarized as follows.

According to the present invention, a semiconductor apparatus includes a semiconductor device, a case surrounding the semiconductor device, a spring terminal including a first connection portion extending to a top surface of the case along a side surface of the case, and a second connection portion provided on the top surface of the case and a control substrate provided on the second connection portion, wherein the first connection portion is fixed to the case and connected to the semiconductor device, the second connection portion includes a first end connected to an end of the first connection portion on a side of the top surface of the case, and a second end opposite to the first end, the second connection portion being a flat plate and having an elastic force using the first end as a supporting point, the second end contacts the control substrate with an elastic force, and the second connection portion has a constriction structure having a notch formed in a side surface along a longitudinal direction.

According to the present invention, a semiconductor apparatus includes a semiconductor device, a case surrounding the semiconductor device, a spring terminal including a first connection portion extending toward a top surface of the case along a side surface of the case, a second connection portion provided on the top surface of the case, and an elastic portion provided between the first connection portion and the second connection portion and a control substrate provided on the second connection portion, wherein the first connection portion is fixed to the case and connected to the semiconductor device, the second connection portion includes a first end connected to the elastic portion, and a second end opposite to the first end, the second connection portion having a flat plate shape, the second end contacts the control substrate by an elastic force of the elastic portion, and a width of the second connection portion as viewed along a direction vertical to the top surface of the case is smaller than a width of the second connection portion in the direction vertical to the top surface of the case.

Other and further objects, features and advantages of the invention will appear more fully from the following description.

DESCRIPTION OF EMBODIMENTS

A semiconductor apparatus according to an embodiment of the present invention will be described with reference to the accompanying drawings. Components identical or corresponding to each other are indicated by the same reference characters, and repeated description of them is avoided in some cases.

First Embodiment

Figure 1:
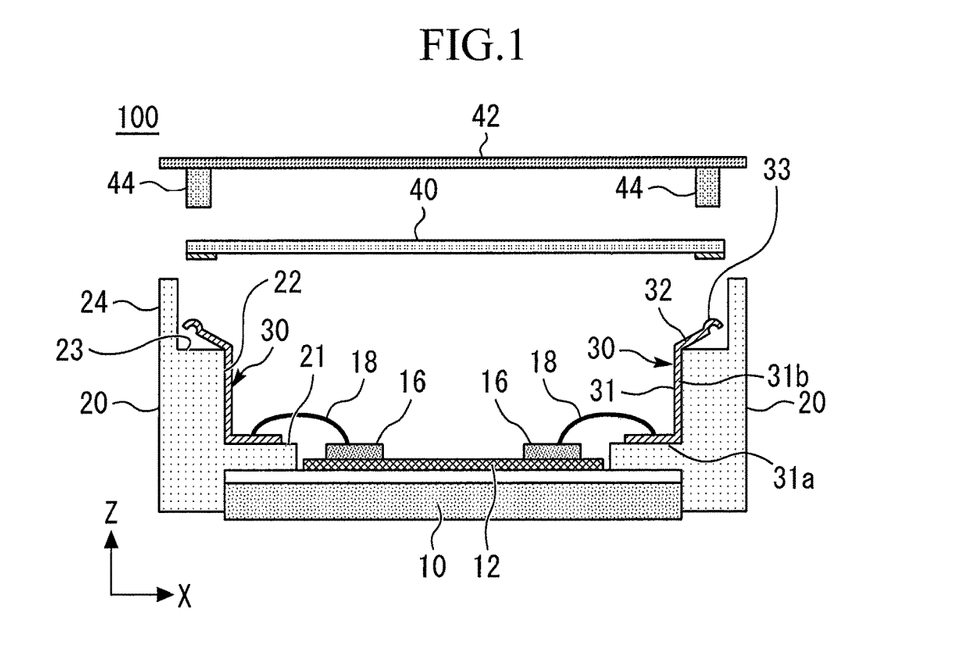
FIG. 1 is a sectional view illustrating a semiconductor apparatus according to a first embodiment.

FIG. 1 is a sectional view illustrating a semiconductor apparatus 100 according to a first embodiment. The semiconductor apparatus 100 includes a heat dissipation metal plate 10. An insulating substrate 12 is provided on the heat dissipation metal plate 10. The heat dissipation metal plate 10 and the insulating substrate 12 may have such a structure that the heat dissipation metal plate 10 and the insulating substrate 12 are integrated into a base plate. The base plate includes, for example, a resin insulating layer and a copper plate. The insulating substrate 12 may be formed of, for example, a ceramic material such as alumina or aluminum nitride.

Semiconductor devices 16 are provided on the insulating substrate 12. Each of the semiconductor devices 16 is a power semiconductor chip. The semiconductor apparatus 100 according to the first embodiment is a power semiconductor module.

A case 20 is provided on the heat dissipation metal plate 10. The case 20 surrounds the semiconductor devices 16. The case 20 includes a pedestal portion 21 which extends to a top surface of the heat dissipation metal plate 10. A side surface 22 of the case 20 that faces the semiconductor devices 16 extends in a direction vertical to the top surface of the insulating substrate 12.

The semiconductor apparatus 100 includes spring terminals 30. Each of the spring terminals 30 includes a first connection portion 31 and a second connection portion 32. The first connection portion 31 extends to a top surface 23 of the case 20 along the side surface 22 of the case 20. The top surface 23 of the case 20 is parallel to the top surface of the insulating substrate 12. The first connection portion 31 is fixed to the case 20. The first connection portion 31 is connected to each of the semiconductor devices 16 with a wire 18. The spring terminals 30 and the semiconductor devices 16 are electrically connected by wire bonding.

The first connection portion 31 includes a horizontal portion 31a that is provided on the top surface of the pedestal portion 21. The horizontal portion 31a extends along the top surface of the pedestal portion 21. The horizontal portion 31a is connected to each semiconductor device 16 with the wire 18. The first connection portion 31 includes a vertical portion 31b that extends along the side surface 22. The vertical portion 31b extends from the pedestal portion 21 to the top surface 23 of the case.

The second connection portion 32 is provided on the top surface 23 of the case 20. The second connection portion 32 extends from an end of the first connection portion 31 on the side of the top surface 23 of the case 20. The second connection portion 32 includes a first end that is connected to the end of the first connection portion 31 on the side of the top surface 23 of the case 20, and a second end opposite to the first end. The second connection portion 32 has an elastic force in a direction vertical to the top surface 23 of the case 20 using the first end as a supporting point. In a state where a control substrate 40 is not connected, the second end of the second connection portion 32 floats above the top surface 23.

The spring terminals 30 and the case 20 are formed by insert molding. The method for forming the spring terminals 30 and the case 20 is not limited to insert molding, but instead the spring terminals 30 may be outserted to the case 20. The spring terminals 30 may be attached to the case 20 with screws or the like after molding the case 20.

In the first embodiment, the semiconductor apparatus 100 includes two semiconductor devices 16. However, the number of semiconductor devices 16 is not limited to two, as long as the semiconductor apparatus 100 includes at least one semiconductor device 16. In the first embodiment, the semiconductor apparatus 100 also includes two spring terminals 30. The number of spring terminals 30 is not limited to two, as long as the semiconductor apparatus 100 includes at least one spring terminal 30.

The semiconductor apparatus 100 includes a control substrate 40. The control substrate 40 includes a drive circuit or a protection circuit for the semiconductor device 16. The control substrate 40 drives or protects the semiconductor device 16. The semiconductor apparatus 100 also includes a lid 42. The lid 42 is provided above the control substrate 40. The lid 42 is provided with projections 44 that project toward the control substrate 40.

Figure 2:
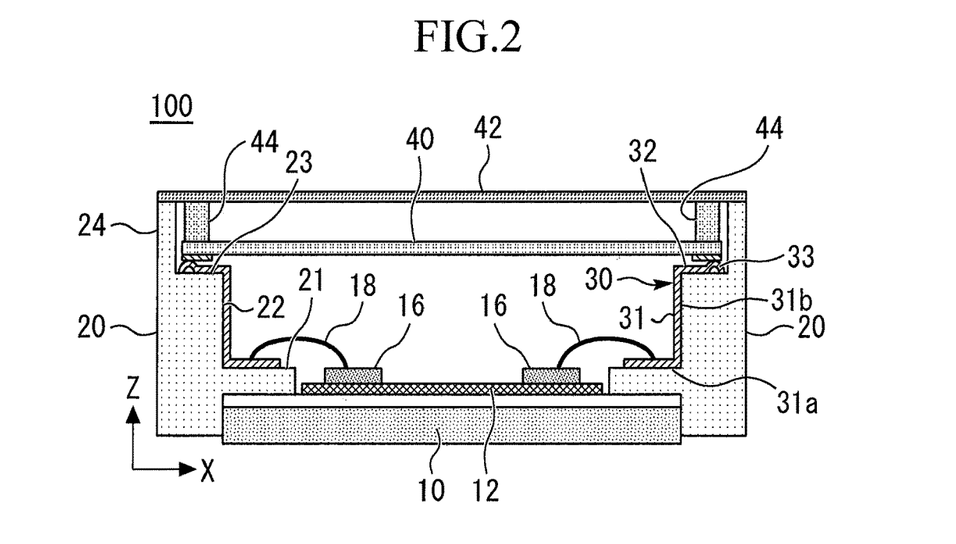
FIG. 2 is a sectional view illustrating a state where the semiconductor apparatus according to the first embodiment is assembled.

FIG. 2 is a sectional view illustrating a state where the semiconductor apparatus 100 according to the first embodiment is assembled. In FIG. 2, the spring terminals 30 and the control substrate 40 are connected to each other. Referring to FIG. 2, the lid 42 is attached to the case 20. The lid 42 covers an area surrounded by the case 20.

The control substrate 40 is provided on the case 20 and is disposed above the semiconductor devices 16. The control substrate 40 is provided on the second connection portion 32. The second end of the second connection portion 32 is provided with a convex portion 33. The convex portion 33 projects in a direction opposite to the top surface 23 of the case 20. The convex portion 33 contacts the control substrate 40. As a result, the control substrate 40 and the spring terminals 30 are electrically connected to each other.

The case 20 is provided with an outer peripheral portion 24. The outer peripheral portion 24 is provided at an opposite side of an area in which the semiconductor devices 16 are provided with respect to the top surface 23. The outer peripheral portion 24 is provided outside the top surface 23. The outer peripheral portion 24 projects in a direction vertical to the top surface 23. An upper end of the outer peripheral portion 24 is provided at a position higher than the top surface 23. The lid 42 is provided on the outer peripheral portion 24. When the lid 42 is disposed on the outer peripheral portion 24, the projections 44 press the control substrate 40. Accordingly, the second connection portions 32 each having an elastic force are pressed against the top surface 23 by the control substrate 40.

Specifically, the lid 42 presses the control substrate 40 and the second connection portions 32 toward the top surface 23 of the case 20 from above. As a result, the second end of each second connection portion 32 contacts the control substrate 40 with an elastic force. In the first embodiment, the control substrate 40 and the spring terminals 30 are pressed by the lid 42 and thus are electrically connected to each other. The second end of each second connection portion 32 and the control substrate 40 are not joined together with a joining material such as solder.

In a state where the lid 42 is attached to the case 20, the second connection portions 32 are sandwiched between the top surface 23 and the control substrate 40. As a result, each second connection portion 32 extends in parallel to the top surface 23. However, the structure of the present invention is not limited to this. In the state where the lid 42 is attached to the case 20, the second end may float above the top surface 23, as long as the control substrate 40 and the second connection portion 32 are in contact with each other. Any structure may be employed as the lid 42, as long as the lid 42 can be easily attached to the case 20 and the control substrate 40 can be pressed and fixed.

Figure 3:
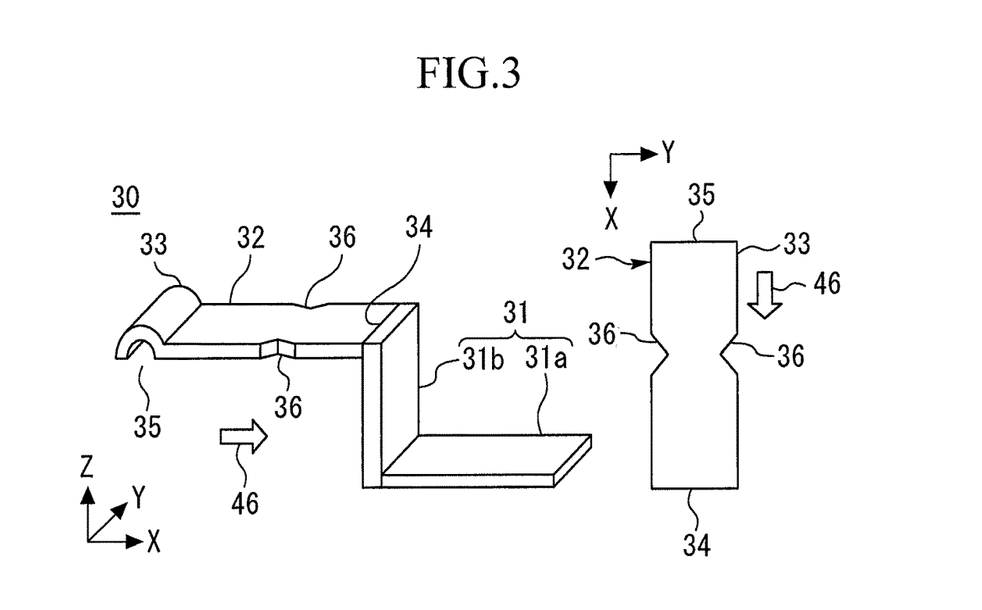
FIG. 3 is a diagram illustrating the structure of each spring terminal according to the first embodiment.

FIG. 3 is a diagram illustrating the structure of each spring terminal 30 according to the first embodiment. The spring terminal 30 is formed of a flat plate. The spring terminal 30 can be easily prepared by punching out a metal plate using equipment such as a pressing machine. The horizontal portion 31a of the first connection portion 31 extends in an x-axis direction. The x-axis direction corresponds to the horizontal direction. The vertical portion 31b of the first connection portion 31 extends in a z-axis direction. The z-axis direction corresponds to the vertical direction and the direction vertical to the top surface 23 of the case 20. An arrow 46 indicates a direction in which the semiconductor devices 16 are provided.

The second connection portion 32 has a flat plate shape and has an elastic force using a first end 34 as a supporting point. The second connection portion 32 has a constriction structure. The constriction structure is provided with a plurality of notches 36 that are formed in both side surfaces of the second connection portion 32 along the longitudinal direction. The second connection portion 32 is provided with two notches 36. The notches 36 are formed over an area from the top surface to the back surface of the second connection portion 32. In this case, the top surface of the second connection portion 32 is a surface opposite to the top surface 23 of the case 20. The back surface of the second connection portion 32 is a surface faces the top surface 23 of the case 20.

The convex portion 33 which is provided at a second end 35 is continuously formed from one end to the other end of the second connection portion 32 in the transverse direction thereof. The convex portion 33 includes a ridge along the transverse direction of the second connection portion 32. A tip end of the convex portion 33 has a curved shape. An outer edge of the convex portion 33 is formed of a curved surface.

As illustrated in the plan view of FIG. 3 illustrating the second connection portion 32, the two notches 36 are provided so as to face each other in the transverse direction of the second connection portion 32. Each of the two notches 36 has a triangular shape as viewed along the direction vertical to the top surface 23 of the case 20. In this case, the top surface 23 of the case 20 is parallel to an x-y plane.

Figure 4:
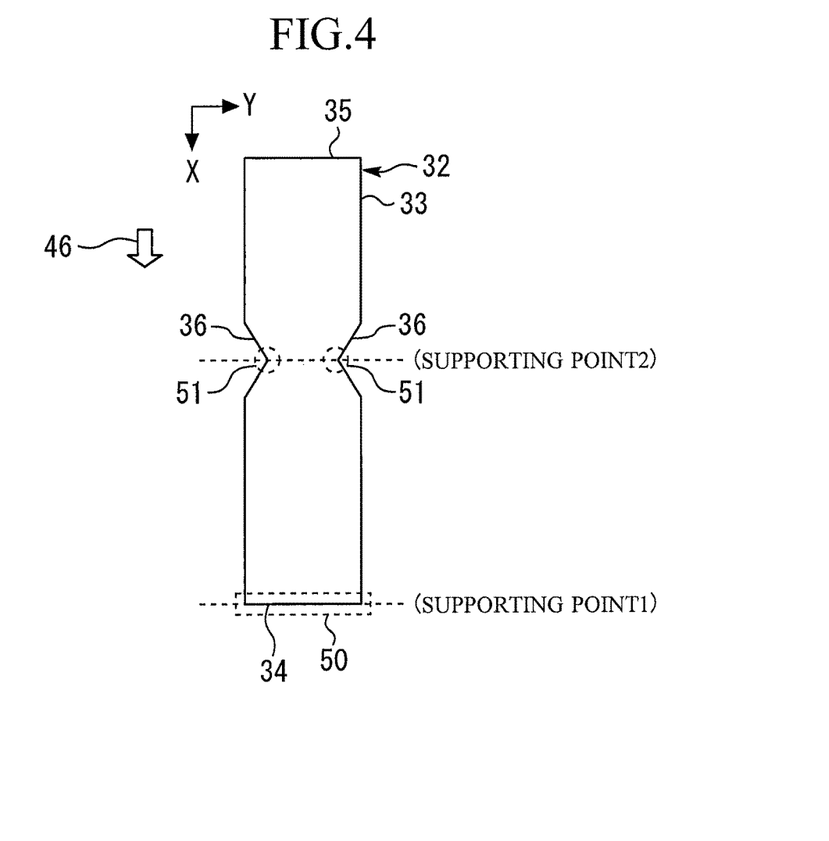
FIG. 4 is a plan view illustrating a second connection portion according to the first embodiment.

FIG. 4 is a plan view illustrating the second connection portion 32 according to the first embodiment. A stress that acts on the second connection portion 32 in a state where the control substrate 40 and the second connection portion 32 are in contact with each other will be described with reference to FIG. 4. When the second connection portion 32 does not have a constriction structure, the first end 34, which is a connection portion between the second connection portion 32 and the first connection portion 31 serves as a supporting point 1, and the second end 35, which is a point of action, contacts the control substrate 40 with an elastic force. At this time, the stress acts on an area indicated by a broken line frame 50.

On the other hand, when the second connection portion 32 has a constriction structure, the supporting point of the elastic contact is distributed to the supporting point 1 and a plurality of supporting points 2. The plurality of supporting points 2 are respectively formed at apex portions of the plurality of notches 36. At this time, the stress generated when the second end 35 contacts the control substrate 40 with an elastic force acts on the area indicated by the broken line frame 50 and areas indicated by two broken line frames 51, respectively.

In the first embodiment, the second connection portion 32 has a constriction structure, which increases the degree of freedom of the spring terminal 30 in a direction along the top surface 23 of the case 20. Further, the supporting point is distributed, which facilitates the distribution of the stress due to the elastic contact of the second end 35 to the control substrate 40. At this time, in particular, the stress in the direction along the top surface 23 of the case 20 is relaxed. The plurality of supporting points 2 is provided at positions closer to the second end 35, which is a point of action, than the supporting point 1. Accordingly, a displacement between the supporting point and the point of action is reduced as compared with a case where no constriction structure is provided. Therefore, the stress is likely to be relaxed.

In the power semiconductor module, for example, when the contact spring terminal being energized is thermally expanded or contracted, a force may act in a direction in which the contact spring terminal deviates from the control substrate. On the other hand, in the first embodiment, the degree of freedom of the spring terminal 30 in the direction along the top surface 23 of the case 20 is high. In addition, the spring terminal 30 has a constriction structure in which a stress is likely to be distributed. Accordingly, even if a positional deviation occurs in the control substrate 40, the spring terminal 30 can easily follow the positional deviation. Therefore, the reliability of contact between the spring terminal 30 and the control substrate 40 can be improved.

Further, the first connection portion 31 is fixed to the case 20 and connected to each semiconductor device 16 by wire bonding. Accordingly, a load on the substrate or the semiconductor device can be reduced as compared with a structure in which the spring terminal is in direct contact with the substrate or each semiconductor device 16. Therefore, the reliability of contact between the spring terminal 30 and the semiconductor devices 16 can be improved.

Furthermore, in the first embodiment, the convex portion 33 with a curved tip end contacts the control substrate 40. The curved surface forming the outer edge of the convex portion 33 and the control substrate 40 contact each other, thereby allowing the convex portion 33 to smoothly move and easily follow a positional deviation of the control substrate 40.

As a modified example of the first embodiment, a structure other than the constriction structure may be used, as long as the width in the transverse direction of the second connection portion 32 as viewed along the direction vertical to the top surface 23 of the case 20 is narrowed. For example, the second connection portion 32 may have a constriction structure provided with the notches 36 formed on a side surface along the longitudinal direction. The constriction structure may be provided with three or more notches 36.

Moreover, in the first embodiment, the first connection portion 31 includes the horizontal portion 31a and the vertical portion 31b. The structure of the first connection portion 31 is not limited to this, as long as the first connection portion 31 extends to the top surface 23 of the case 20, is fixed to the case 20, and is connected to each semiconductor device 16. For example, the first connection portion 31 may include only the vertical portion 31b, and the vertical portion 31b may be connected to each semiconductor device 16 with the wire 18.

These modifications can be applied, as appropriate, to a semiconductor apparatus according to the following embodiments. Note that the semiconductor apparatus according to the following embodiments are similar to those of the first embodiment in many respects, and thus differences between the semiconductor apparatus according to the following embodiments and those of the first embodiment will be mainly described below.

Second Embodiment

Figure 5:
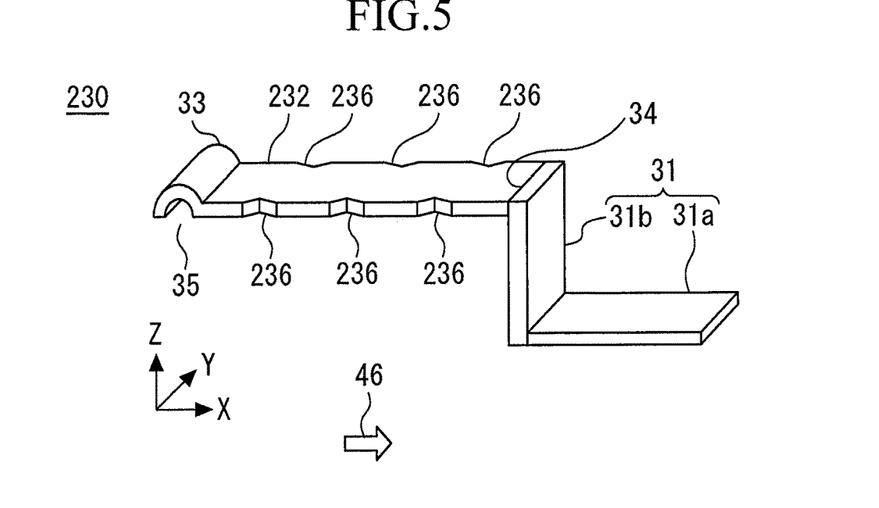
FIG. 5 is a perspective view illustrating a spring terminal according to a second embodiment.

FIG. 5 is a perspective view illustrating a spring terminal 230 according to a second embodiment. The structure of the spring terminal 230 according to the second embodiment is different from that of first embodiment. A second connection portion 232 has a constriction structure. The constriction structure is provided with a plurality of notches 236 respectively formed in both side surfaces of the second connection portion 232 along the longitudinal direction. The second connection portion 232 is provided with six notches 236.

Figure 6:
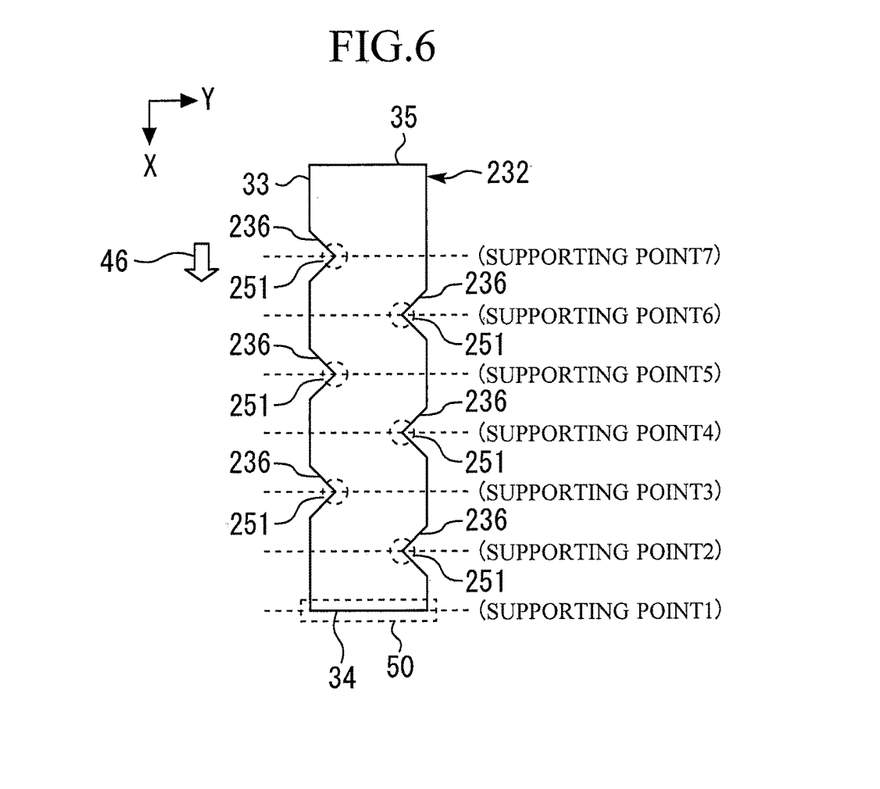
FIG. 6 is a plan view illustrating a second connection portion according to the second embodiment.

FIG. 6 is a plan view illustrating the second connection portion 232 according to the second embodiment. Among the plurality of notches 236, the notch 236 formed in one of the both side surfaces of the second connection portion 232 along the longitudinal direction and the notch 236 formed in the other one of the side surfaces are deviated from each other in the longitudinal direction. Each of the plurality of notches 236 has a triangular shape as viewed along the direction vertical to the top surface 23 of the case 20.

A stress that acts on the second connection portion 232 in a state where the control substrate 40 and the second connection portion 232 are in contact with each other will be described with reference to FIG. 6. When a constriction structure is provided, the supporting point of the elastic contact is distributed to supporting points 1 to 7. The supporting points 2 to 7 are respectively formed at apex portions of the plurality of notches 236. At this time, a stress generated when the second end 35 contacts the control substrate 40 with an elastic force acts on the area indicated by the broken line frame 50 and areas indicated by a plurality of broken line frame 251, respectively.

In the second embodiment, the second connection portion 232 has a constriction structure, which increases the degree of freedom of the spring terminal 230 in a direction along the top surface 23 of the case 20. In addition, the plurality of supporting points 1 to 7 are formed on the second connection portion 232, so that the stress is distributed to the plurality of notches 236. Accordingly, a stress generated due to the elastic contact of the second end 35 to the control substrate 40 is relaxed.

In the second embodiment, the spring terminal 230 can more easily follow a positional deviation of the control substrate 40 than in the first embodiment. Accordingly, the reliability of contact between the spring terminal 230 and the control substrate 40 can be further improved. Further, one of the plurality of notches 236 in one of the both side surfaces in the longitudinal direction of the second connection portion 232 and another of the plurality of notches 236 in the other one of the both side surfaces are deviated from each other in the longitudinal direction. Therefore, an occurrence of a breakage due to cracking, aged deterioration, or the like between the areas indicated by the plurality of broken line frames 251, respectively, in which the stress is concentrated can be suppressed.

In the second embodiment, the second connection portion 232 includes six notches 236. As a modified example of the second embodiment, the second connection portion 232 may include one or more notches 236 in both side surfaces in the longitudinal direction.

Third Embodiment

Figure 7:
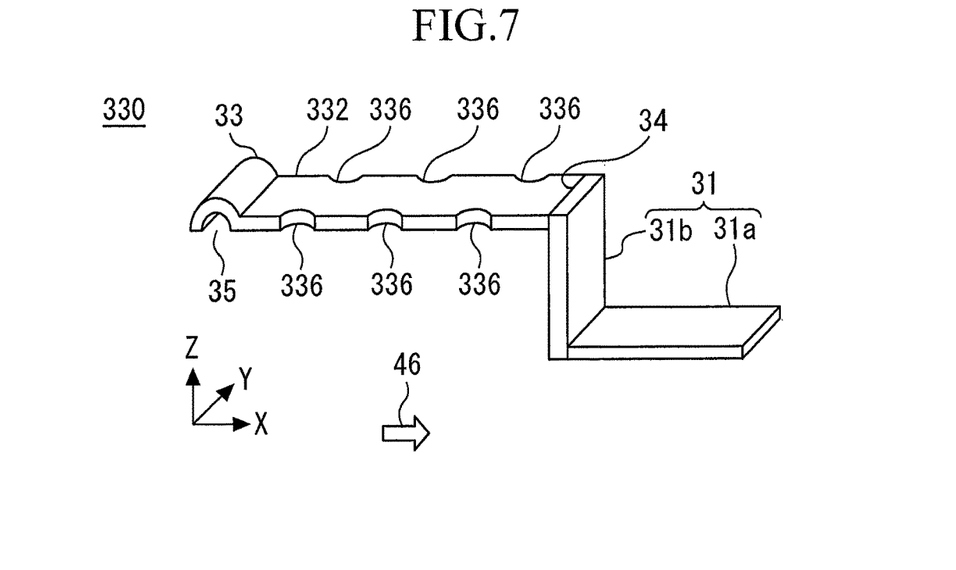
FIG. 7 is a perspective view illustrating a spring terminal according to a third embodiment.

FIG. 7 is a perspective view illustrating a spring terminal 330 according to a third embodiment. The structure of a plurality of notches 336 in the third embodiment is different from that in the second embodiment. A second connection portion 332 has a constriction structure. The constriction structure is provided with the plurality of notches 336 respectively formed in both side surfaces of the second connection portion 332 along the longitudinal direction. The second connection portion 332 is provided with six notches 336.

Figure 8:
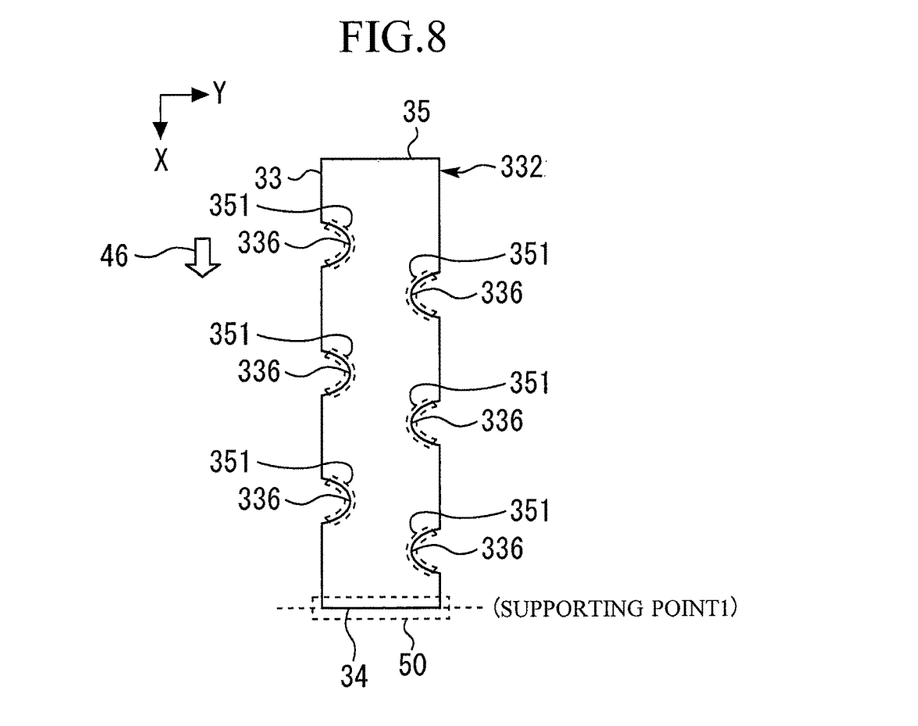
FIG. 8 is a plan view illustrating a second connection portion according to the third embodiment.

FIG. 8 is a plan view illustrating the second connection portion 332 according to the third embodiment. Each of the plurality of notches 336 has a curved surface. The outer edge of each of the notches 336 is formed of a curved surface. Each of the plurality of notches 336 has no apex, unlike the notches 36.

A stress that acts on the second connection portion 332 in a state where the control substrate 40 and the second connection portion 332 are in contact with each other will be described with reference to FIG. 8. A stress generated when the second end 35 contacts the control substrate 40 with an elastic force acts on the area indicated by the broken line frame 50 and areas indicated by a plurality of broken line frames 351, respectively. As indicated by each of the plurality of broken line frames 351, the stress in each notch 336 is distributed over the entire curved surface forming the outer edge of the notches 336.

In the third embodiment, a stress generated due to the elastic contact of the second end 35 to the control substrate 40 is distributed to the plurality of notches 336. This stress is distributed also within the curved surface of each notch 336. Accordingly, the stress is more likely to be relaxed than in the second embodiment. Therefore, the reliability of contact between the spring terminal 330 and the control substrate 40 can be improved.

Each of the notches 336 is not provided with a corner portion which is formed in the notches 236 and at which the stress is concentrated. Accordingly, an occurrence of a breakage due to cracking, aged deterioration, or the like on the spring terminal 330 can be suppressed.

The shape of each of the plurality of notches 336 is not limited to the shape illustrated in FIG. 8. The plurality of notches 336 may also have other shapes, as long as the notches have a curved surface on which the stress is distributed.

Fourth Embodiment

Figure 9:
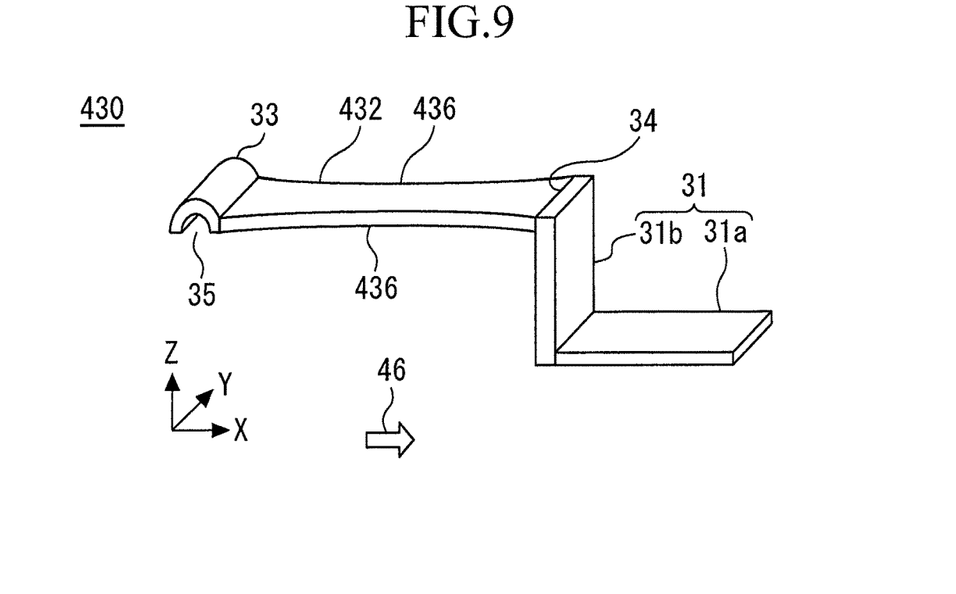
FIG. 9 is a perspective view illustrating a spring terminal according to a fourth embodiment.

FIG. 9 is a perspective view illustrating a spring terminal 430 according to a fourth embodiment. The structure of the spring terminal 430 according to the fourth embodiment is different from that of the first embodiment. A second connection portion 432 has a constriction structure. The constriction structure is provided with a plurality of notches 436 respectively formed in the both side surfaces of the second connection portion 432 along the longitudinal direction. The second connection portion 432 is provided with two notches 436.

Figure 10:
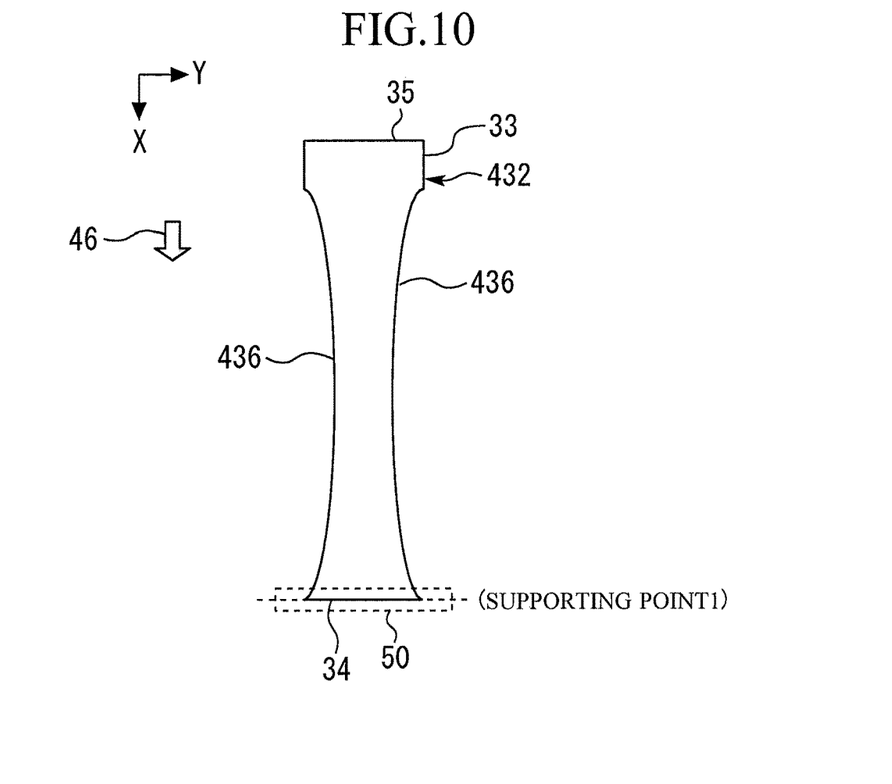
FIG. 10 is a plan view illustrating a second connection portion of the fourth embodiment.

FIG. 10 is a plan view illustrating the second connection portion 432 of the fourth embodiment. Each of the plurality of notches 436 has a curved surface formed over the area between the first end 34 and the second end 35. The width in the transverse direction of the second connection portion 432 as viewed along the direction vertical to the top surface 23 of the case 20 is minimum at a central portion in the longitudinal direction.

A stress that acts on the second connection portion 432 in a state where the control substrate 40 and the second connection portion 432 are in contact with each other will be described with reference to FIG. 10. A stress generated when the second end 35 contacts the control substrate 40 with an elastic force acts on the area indicated by the broken line frame 50 and the plurality of curved surfaces of the respective notches 436. The stress in each notch 436 is distributed over the entire curved surface.

In the fourth embodiment, the stress generated when the second end 35 elastically contacts the control substrate 40 is distributed over the both side surfaces between the first end 34 and the second end 35. Accordingly, the stress is more likely to be relaxed than in the first to third embodiments. Therefore, the reliability of contact between the spring terminal 430 and the control substrate 40 can be further improved.

Moreover, since the spring terminal 430 is provided with the plurality of notches 436, the width of the spring terminal 430 in the traverse direction as viewed along the direction vertical to the top surface 23 of the case 20 is decreased in the area between the first end 34 and the second end 35. Accordingly, the spring terminal 430 can easily follow a positional deviation of the control substrate 40 in the direction along the top surface 23 of the case 20. Therefore, the reliability of contact between the spring terminal 430 and the control substrate 40 can be further improved.

Fifth Embodiment

Figure 11:
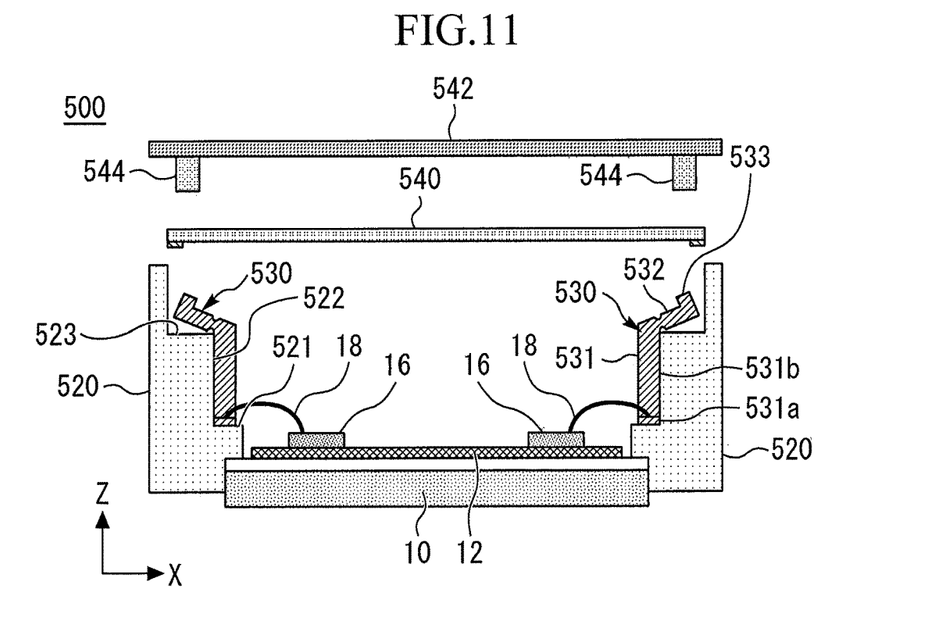
FIG. 11 is a sectional view illustrating a semiconductor apparatus according to a fifth embodiment.

FIG. 11 is a sectional view illustrating a semiconductor apparatus 500 according to a fifth embodiment. The semiconductor apparatus 500 includes a case 520. The semiconductor apparatus 500 also includes a spring terminal 530. The spring terminal 530 includes a first connection portion 531. The first connection portion 531 of the spring terminal 530 extends toward a top surface 523 of the case 520 along a side surface 522 of the case 520.

The first connection portion 531 includes a horizontal portion 531a. The horizontal portion 531a has a flat plate shape and extends in a y-axis direction. The horizontal portion 531a is provided on a top surface of a pedestal portion 521. The horizontal portion 531a is provided along the side surface 522. The first connection portion 531 also includes a vertical portion 531b. The vertical portion 531b extends in the z-axis direction. The vertical portion 531b extends to a position above the top surface 523 of the case from the pedestal portion 21 along the side surface 522.

The spring terminal 530 includes a second connection portion 532. The second connection portion 532 is provided on the top surface 523 of the case 520. In a state where a control substrate 540 is not connected, the second end, which is an end opposite to the first connection portion 531, of the second connection portion 532 floats above the top surface 523. The second end of the second connection portion 532 is provided with a convex portion 533. The convex portion 533 projects in a direction opposite to the top surface 523 of the case 520.

The semiconductor apparatus 500 includes the control substrate 540. The semiconductor apparatus 500 also includes a lid 542. The lid 542 is provided above the control substrate 540. The lid 542 is provided with projections 544 projecting toward the control substrate 540.

Figure 12:
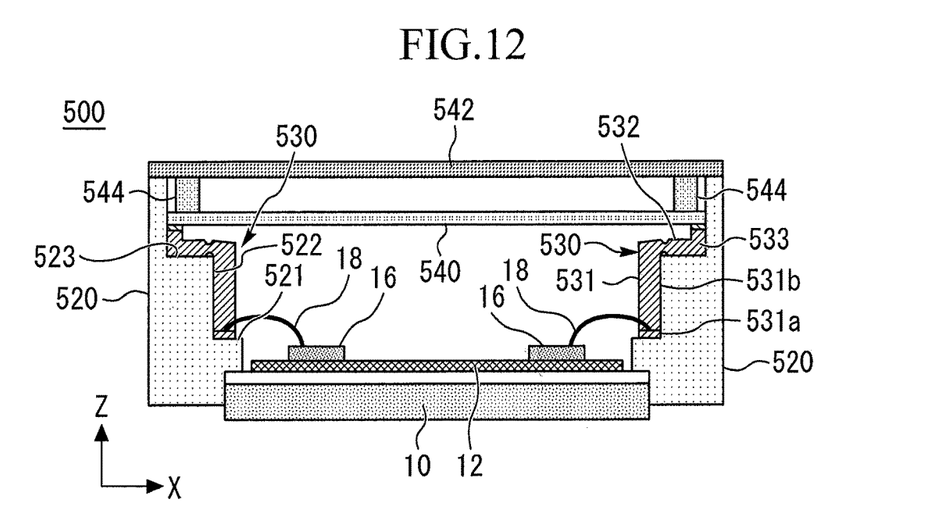
FIG. 12 is a sectional view illustrating a state where the semiconductor apparatus according to the fifth embodiment is assembled.

FIG. 12 is a sectional view illustrating a state where the semiconductor apparatus 500 according to the fifth embodiment is assembled. Referring to FIG. 12, the spring terminal 530 and the control substrate 540 are connected. The lid 542 is attached to the case 520. The control substrate 540 is provided above the second connection portion 532.

In the fifth embodiment, like in the first to fifth embodiments, the lid 542 presses the control substrate 540 from above, thereby allowing the spring terminal 530 and the control substrate 540 to be elastically connected. At this time, the control substrate 540 and the convex portion 533 provided at the second end are in contact with each other. The second end and the control substrate 540 are not joined together.

Figure 13:
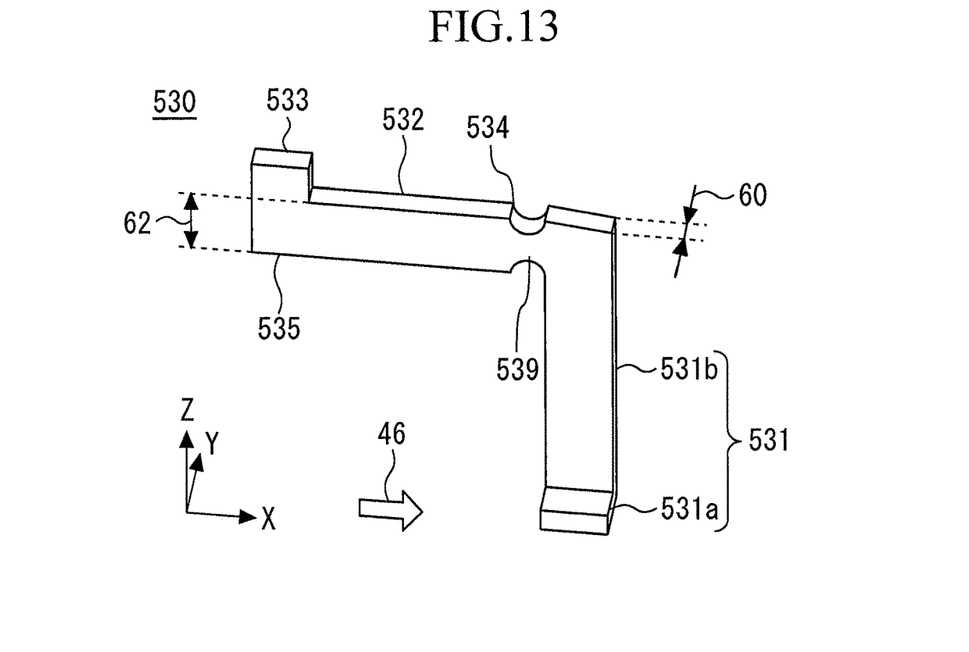
FIG. 13 is a perspective view illustrating a spring terminal according to the fifth embodiment.

FIG. 13 is a perspective view illustrating the spring terminal 530 according to the fifth embodiment. In the spring terminal 530, an elastic portion 539 is provided between the first connection portion 531 and the second connection portion 532. The second connection portion 532 has a first end 534 connected to the elastic portion 539, and a second end 535 opposite to the first end 534. The second connection portion 532 has a flat plate shape.

A width 60 of the second connection portion 532 as viewed along the direction vertical to the top surface 523 of the case 520 is smaller than a width 62 of the second connection portion 532 in the direction vertical to the top surface 523 of the case 520. In this case, the width 60 is a width of the second connection portion 532 in the y-axis direction. Specifically, the width 60 is a width in the transverse direction of a surface of the second connection portion 532 that faces the top surface 523 of the case 520. The width 62 is a width in the vertical direction of a surface of the second connection portion 532 that faces the top surface 523 of the case 520. The width of the convex portion 533 as viewed along the direction vertical to the top surface 523 of the case 520 is equal to the width 60 of the second connection portion 532 in the same direction.

Figure 14:
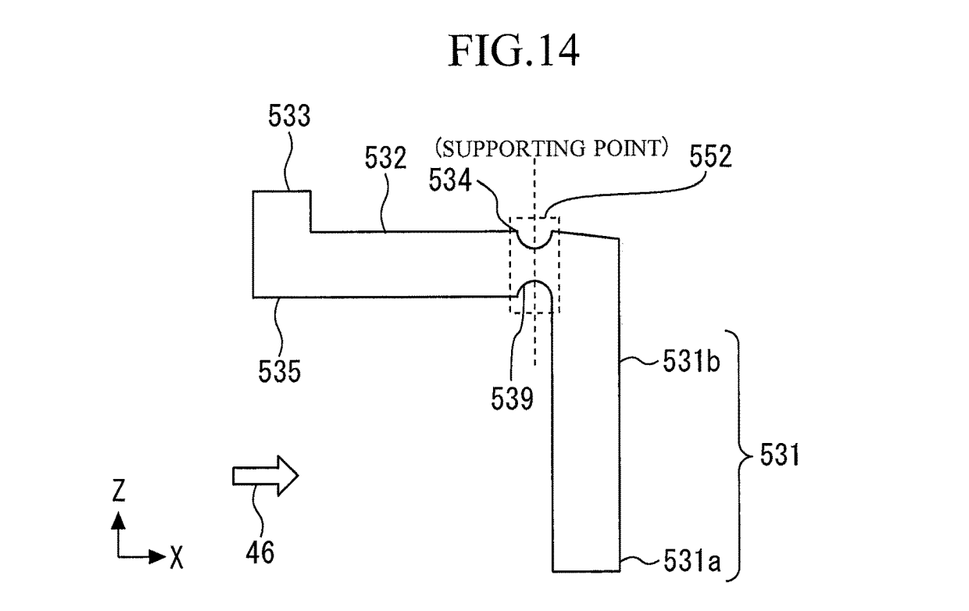
FIG. 14 is a front view illustrating the spring terminal according to the fifth embodiment.

FIG. 14 is a front view illustrating the spring terminal 530 according to the fifth embodiment. The width of the elastic portion 539 in the direction vertical to the top surface 523 of the case 520 is smaller than the width 62 of the second connection portion 532 in the direction vertical to the top surface 523 of the case 520. In other words, the width of the elastic portion 539 is smaller than the second connection portion 532 as viewed along the y-axis direction. The structure in which the width of the elastic portion 539 is smaller than the second connection portion 532 causes an elastic force. The elastic portion 539 allows the spring terminal 530 to have a spring property in the direction vertical to the top surface 523 of the case 520. The elastic portion 539 is provided by forming a constriction in the spring terminal 530 having a flat plate shape.

The elastic force of the elastic portion 539 allows the second end 535 to contact the control substrate 540. At this time, the elastic force generated using the elastic portion 539 as a supporting point allows the convex portion 533 of the second end 535 to contact the control substrate 540. A stress generated when the second end 535 contacts the control substrate 540 with an elastic force acts on an area indicated by a broken line frame 552.

In the fifth embodiment, the width 60 of the second connection portion 532 as viewed along the direction vertical to the top surface 523 of the case 520 is smaller than the width 62 of the second connection portion 532 in the direction vertical to the top surface 523 of the case 520. According to this structure, the degree of freedom of the spring terminal 530 in the direction along the top surface 523 of the case 520 is increased. Accordingly, the spring terminal 530 can easily follow a positional deviation of the control substrate 540 in the direction along the top surface 523 of the case 520. Therefore, the reliability of contact between the control substrate 540 and the spring terminal 530 can be improved.

Moreover, since the width of the spring terminal 530 in the y-axis direction is small, signal terminals of the control substrate 540 can be arranged with a fine pitch. Therefore, the semiconductor apparatus 500 can be downsized.

Sixth Embodiment

Figure 15:
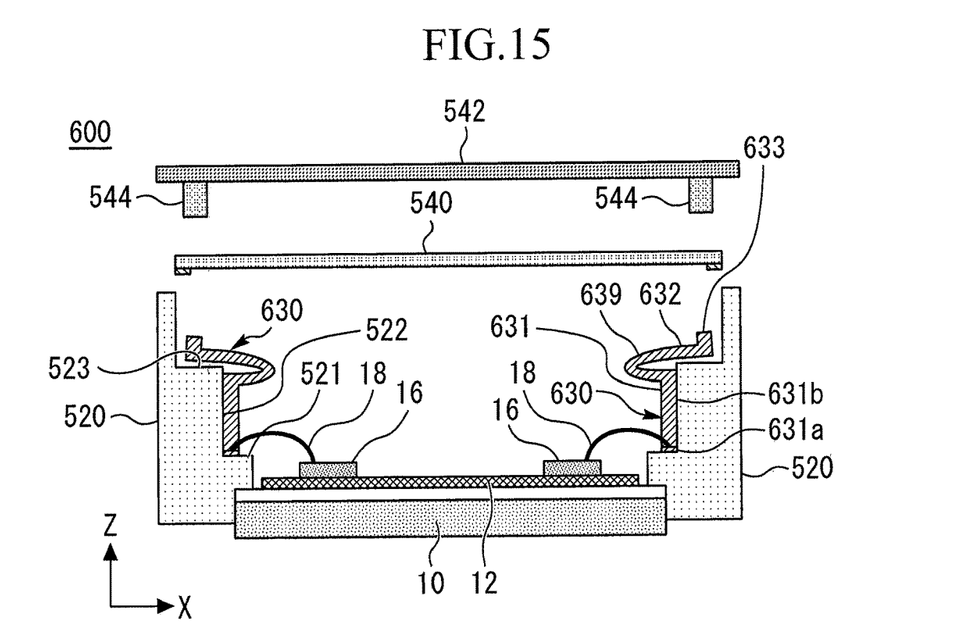
FIG. 15 is a sectional view illustrating a semiconductor apparatus according to a sixth embodiment.

FIG. 15 is a sectional view illustrating a semiconductor apparatus 600 according to a sixth embodiment. The structure of a spring terminal 630 in the sixth embodiment is different from that in the fifth embodiment. The spring terminal 630 includes a first connection portion 631. The first connection portion 631 includes a horizontal portion 631a. The horizontal portion 631a has a flat plate shape and extends in the y-axis direction. The horizontal portion 631a is provided on the top surface of the pedestal portion 521. The horizontal portion 631a is provided along the side surface 522.

The first connection portion 631 includes a vertical portion 631b. The vertical portion 631b extends in the z-axis direction. The vertical portion 631b extends toward the top surface 523 of the case 520 from the pedestal portion 521 along the side surface 522.

The spring terminal 630 includes a second connection portion 632. The second connection portion 632 is provided on the top surface 523 of the case 520. In a state where the control substrate 540 is not connected, the second end, which is an end opposite to the first connection portion 631, of the second connection portion 632 floats above the top surface 523. The second end is provided with a convex portion 633. The convex portion 633 projects in a direction opposite to the top surface 523 of the case 520.

Figure 16:
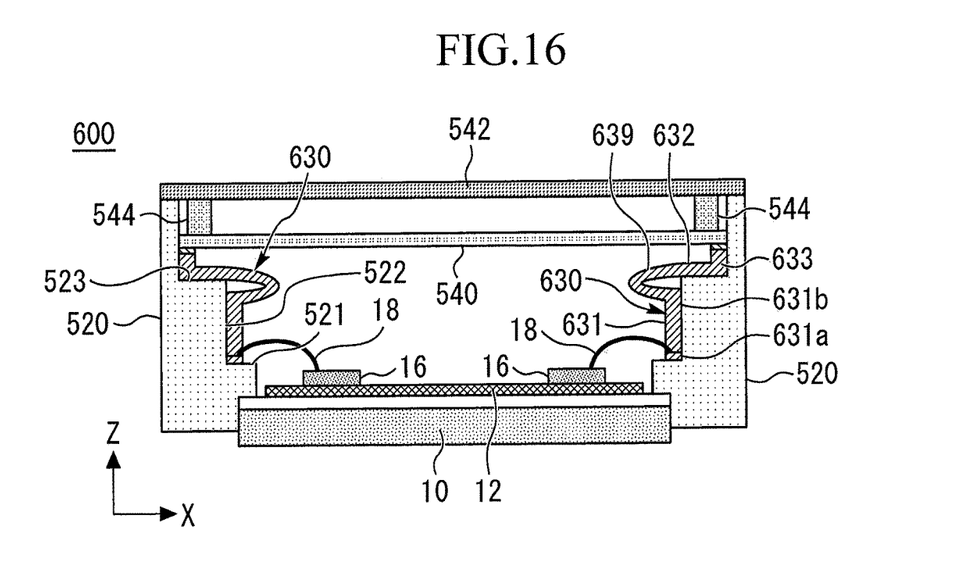
FIG. 16 is a sectional view illustrating a state where the semiconductor apparatus according to the sixth embodiment is assembled.

FIG. 16 is a sectional view illustrating a state where the semiconductor apparatus 600 according to the sixth embodiment is assembled. Referring to FIG. 16, the spring terminal 630 and the control substrate 540 are connected to each other. The control substrate 540 is provided above the second connection portion 632.

In the sixth embodiment, like in the first to fifth embodiments, the lid 542 presses the control substrate 540 from above, thereby allowing the spring terminal 630 and the control substrate 540 to be electrically connected to each other. At this time, the convex portion 633 and the control substrate 540 are in contact with each other. The second end of the second connection portion 632 and the control substrate 540 are not joined together.

Figure 17:
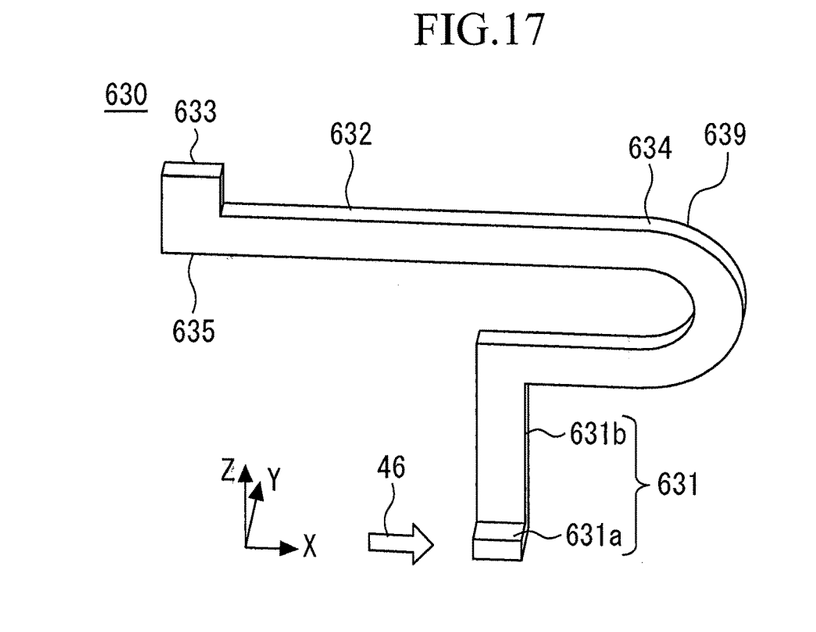
FIG. 17 is a perspective view illustrating a spring terminal according to the sixth embodiment.

FIG. 17 is a perspective view illustrating the spring terminal 630 according to the sixth embodiment. In the sixth embodiment, the structure of an elastic portion 639 is different from that of the fifth embodiment. In the spring terminal 630, the elastic portion 639 is provided between the first connection portion 631 and the second connection portion 632. The second connection portion 632 includes a first end 634 connected to the elastic portion 639, and a second end 635 opposite to the first end 634. The second connection portion 632 has a flat plate shape.

The width of the second connection portion 632 as viewed along the direction vertical to the top surface 523 of the case 520 is smaller than the width of the second connection portion 632 in the direction vertical to the top surface 523 of the case 520. The width of the convex portion 633, which is provided at the second end 635, as viewed along the direction vertical to the top surface 523 of the case 520 is equal to the width of the second connection portion 632 in the same direction.

Figure 18:
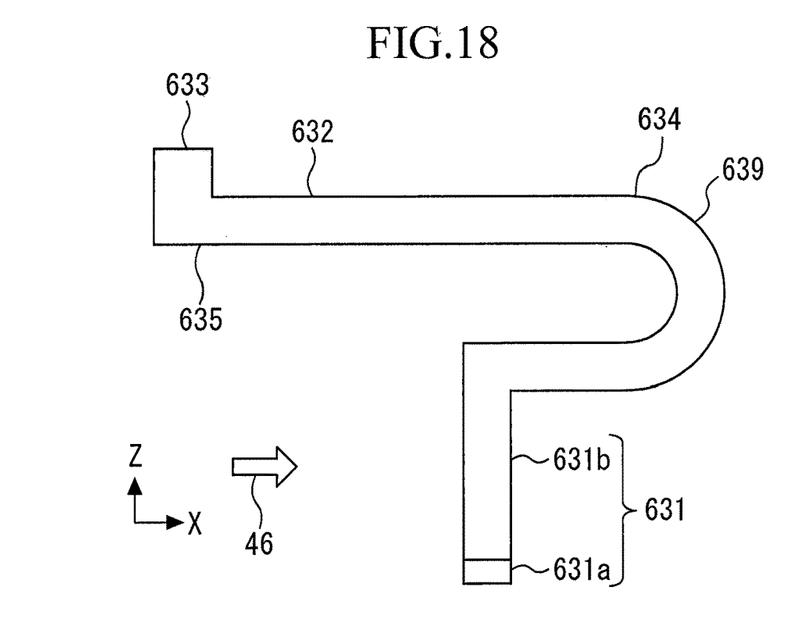
FIG. 18 is a front view illustrating the spring terminal according to the sixth embodiment.

FIG. 18 is a front view illustrating the spring terminal 630 according to the sixth embodiment. The elastic portion 639 is curved in a U-shape so as to project in a direction opposite to the second connection portion 632. The elastic portion 639 is curved in the U-shape, thereby generating an elastic force. The elastic portion 639 allows the spring terminal 630 to have a spring property in the direction vertical to the top surface 523 of the case 520. The elastic force generated by the elastic portion 639 allows the convex portion 633 of the second end 635 to contact the control substrate 540.

Like in the fifth embodiment, the width of the second connection portion 632 as viewed along the direction vertical to the top surface 523 of the case 520 is smaller than the width of the second connection portion 632 in the direction vertical to the top surface 523 of the case 520. Accordingly, the spring terminal 630 can easily follow a positional deviation of the control substrate 540 in the direction along the top surface 523 of the case 520. Therefore, the reliability of contact between the control substrate 540 and the spring terminal 630 can be improved. Like in the fifth embodiment, signal terminals of the control substrate 540 can be arranged with a fine pitch.

Moreover, unlike in the fifth embodiment, there is no need to provide a constriction so that the spring terminal 630 according to the sixth embodiment can obtain an elastic force. Accordingly, an electric resistance of the spring terminal 630 can be reduced as compared with the fifth embodiment. Therefore, the reliability of an electrical connection between the control substrate 540 and the semiconductor devices 16 can be improved.

Meanwhile, technical features explained in each embodiment may be appropriately combined to use.

In the semiconductor apparatus according to the present invention, a notch is provided in a side surface of the second connection portion along the longitudinal direction. Accordingly, the spring terminal can easily follow a positional deviation of the control substrate. Therefore, the reliability of contact between the spring terminal and the control substrate can be improved.

In the semiconductor apparatus according to the present invention, a width of the second connection portion as viewed along a direction vertical to the top surface of the case is smaller than a width of the second connection portion in the direction vertical to the top surface of the case. Accordingly, the spring terminal can easily follow a positional deviation of the control substrate. Therefore, the reliability of contact between the spring terminal and the control substrate can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2017-121516, filed on Jun. 21, 2017 including specification, claims, drawings and summary, on which the Convention priority of the present application is based, are incorporated herein by reference in its entirety.

The invention claimed is:

1. A semiconductor apparatus comprising:
a semiconductor device;
a case surrounding the semiconductor device;
a spring terminal including a first connection portion extending to a top surface of the case along a side surface of the case in contact with the side surface of the case, and a second connection portion provided to directly contact the top surface of the case; and
a control substrate provided to directly contact a top surface of the second connection portion, wherein
the first connection portion is fixed to the case and connected to the semiconductor device,
the second connection portion includes a first end connected to an end of the first connection portion on a side of the top surface of the case, and a second end opposite to the first end, the second connection portion being a flat plate and having an elastic force using the first end as a supporting point,
the second end contacts the control substrate with an elastic force, and
the second connection portion has a constriction structure having a notch formed in a side surface along a longitudinal direction.

2. The semiconductor apparatus according to claim 1, wherein the second end and the control substrate are not joined together.

3. The semiconductor apparatus according to claim 1, wherein
the second end is provided with a convex portion projecting in a direction opposite to the top surface of the case, a tip end of the convex portion being curved, and
the convex portion and the control substrate are in contact with each other.

4. The semiconductor apparatus according to any one of claim 1, wherein the constriction structure is provided with a plurality of notches formed in both side surfaces of the second connection portion along the longitudinal direction.

5. The semiconductor apparatus according to claim 4, wherein one of the plurality of notches that is provided in one of the both side surfaces and another of the plurality of notches that is provided in the other one of the both side surfaces are deviated from each other in the longitudinal direction.

6. The semiconductor apparatus according to claim 4, wherein each of the plurality of notches has a curved surface.

7. The semiconductor apparatus according to claim 4, wherein each of the plurality of notches has a curved surface formed over an area between the first end and the second end.

8. The semiconductor apparatus according to claim 1, further comprising a lid provided above the control substrate, wherein
the lid presses the control substrate and the second connection portion toward the top surface of the case from above, thereby bringing the second end into contact with the control substrate with an elastic force.

9. The semiconductor apparatus according to claim 1, wherein
a first surface of the second end contacts the control substrate with the elastic force and a second surface of the second end that is opposite to the first surface of the second end directly contacts the top surface of the case.

10. The semiconductor apparatus according to claim 1, wherein
a width in a transverse direction of the second connection portion as viewed along a direction vertical to the top surface of the case is narrowed in the constriction structure.

11. A semiconductor apparatus comprising:
a semiconductor device;
a case surrounding the semiconductor device;
a spring terminal including a first connection portion extending toward a top surface of the case along a side surface of the case in contact with the side surface of the case, a second connection portion provided to directly contact the top surface of the case, and an elastic portion provided between the first connection portion and the second connection portion; and
a control substrate provided to directly contact a top surface of the second connection portion, wherein
the first connection portion is fixed to the case and connected to the semiconductor device,
the second connection portion includes a first end connected to the elastic portion, and a second end opposite to the first end, the second connection portion having a flat plate shape,
the second end contacts the control substrate by an elastic force of the elastic portion, and
a width of the second connection portion as viewed along a direction vertical to the top surface of the case is smaller than a width of the second connection portion in the direction of the top surface of the case.

12. The semiconductor apparatus according to claim 11, wherein the second end and the control substrate are not joined together.

13. The semiconductor apparatus according to claim 11, wherein a width of the elastic portion in a direction vertical to the top surface of the case is smaller than a width of the second connection portion in the direction vertical to the top surface of the case.

14. The semiconductor apparatus according to claim 11, wherein the elastic portion is curved in a U-shape to project in a direction opposite to the second connection portion.

15. The semiconductor apparatus according to claim 11, wherein
the second end is provided with a convex portion projecting in a direction opposite to the top surface of the case, and
the convex portion and the control substrate are in contact with each other.

16. The semiconductor apparatus according to claim 11, wherein
a first surface of the second end contacts the control substrate by the elastic force of the elastic portion and a second surface of the second end that is opposite to the first surface of the second end directly contacts the top surface of the case.

* * * * *